United States Patent
Lombaard

(10) Patent No.: US 6,727,730 B1
(45) Date of Patent: Apr. 27, 2004

(54) HIGH SPEED ON-CHIP SIGNALING SYSTEM AND METHOD

(75) Inventor: Carel J. Lombaard, Co. Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/256,416

(22) Filed: Sep. 27, 2002

(51) Int. Cl.[7] .................. H03K 19/0175; H03K 19/094; H03K 19/003

(52) U.S. Cl. ........................... 326/82; 326/116; 326/31; 327/108

(58) Field of Search ............................... 326/82–83, 86, 326/89, 90, 116, 31, 33, 34; 327/108, 109

(56) References Cited

U.S. PATENT DOCUMENTS

| | | | | |
|---|---|---|---|---|
| 5,309,048 | A | * | 5/1994 | Khabbaz ..................... 327/310 |
| 6,025,736 | A | * | 2/2000 | Vora et al. .................... 326/39 |
| 6,600,339 | B2 | * | 7/2003 | Forbes et al. ................. 326/86 |
| 2002/0118042 | A1 | * | 8/2002 | Helt et al. .................... 326/86 |

* cited by examiner

Primary Examiner—Jean Jeanglaude
Assistant Examiner—James H. Cho
(74) Attorney, Agent, or Firm—Kevin L. Daffer; Conley Rose P.C.

(57) ABSTRACT

An improved signaling system and method are provided that uses transconductance signaling rather than voltage or current signaling. A transient voltage applied to a first end of a conductor can produce a varying current placed into a low impedance node at a second end of the conductor. The second end is preferably pinned to a fixed voltage value, and the low impedance second end will allow current upon the second end to freely transition, enabling the conductor to arrive at a steady state condition much sooner than with conventional signaling methods. The present transconductance signaling method avoids large changes in voltage along the greater part of the conductor due to a current sent through this resistive conductor. This greatly improves transient behavior as, for example, evidenced by signal rise and fall times for digital signals produced by this transconductance signaling method. Additionally, less energy will be stored within the conductor per cycle to allow source or drive electronic subsystems to transmit signals at relatively high rates with less deleterious delay at the destination, and with less power wasted in charging and discharging capacitance along the conductor.

18 Claims, 3 Drawing Sheets

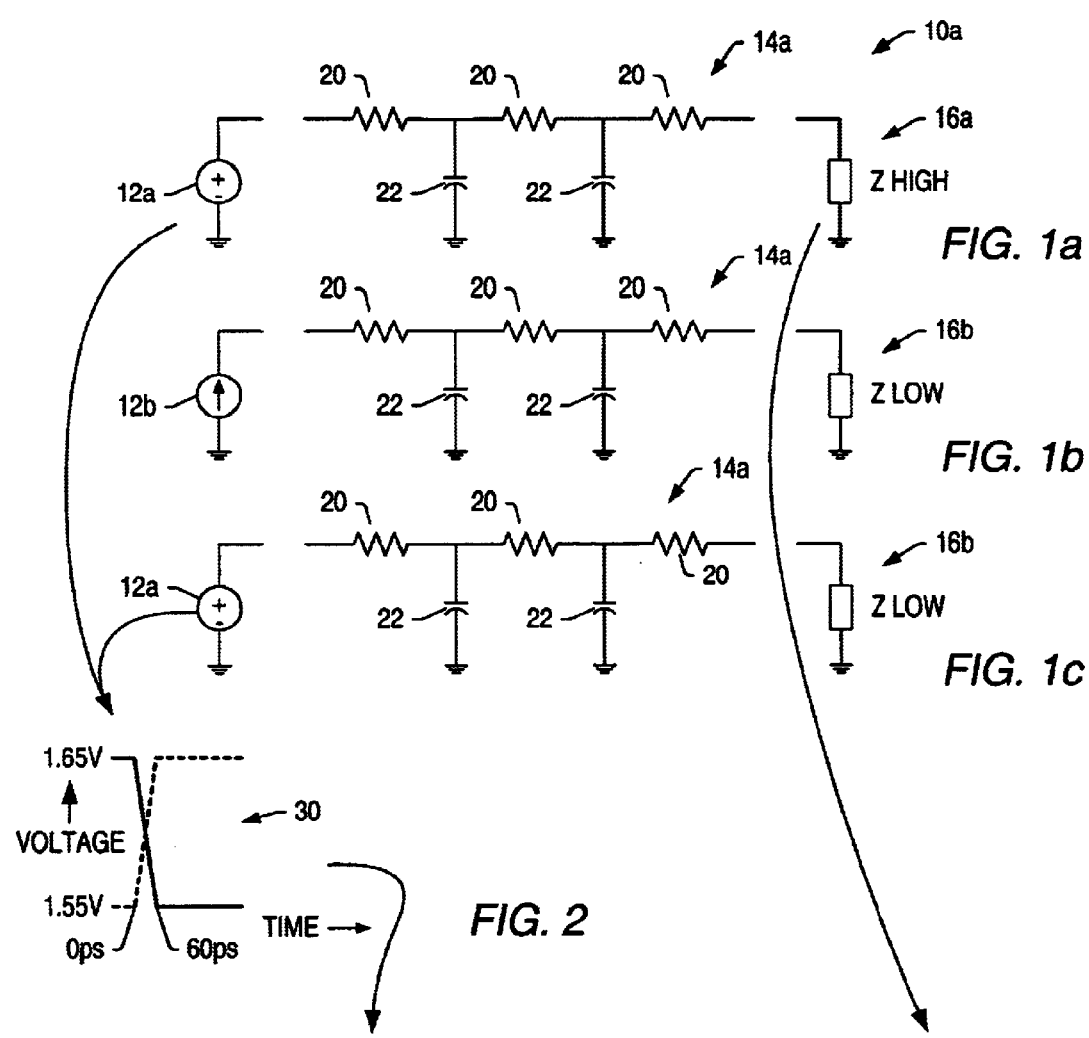
FIG. 1a
FIG. 1b
FIG. 1c
FIG. 2
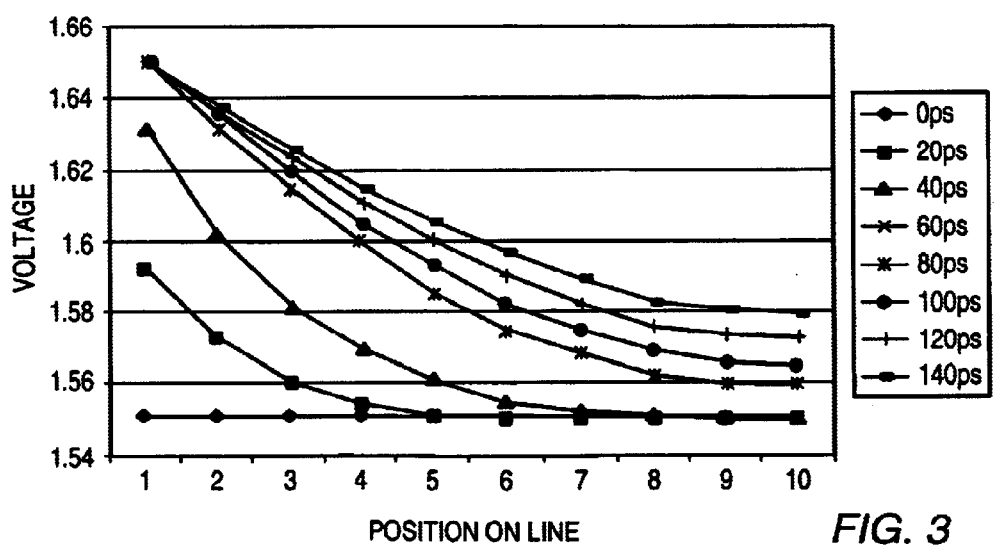
FIG. 3

HIGH SPEED ON-CHIP SIGNALING SYSTEM AND METHOD

BACKGROUND OF THE INVENTION

1. Field of the Invention

This invention relates to a high speed signaling system and, more particularly, to circuitry used to forward high frequency signals across a line with minimal charge storage, power consumption and signal attenuation as caused by parasitic properties of the line, even though the line might extend a substantial distance across a semiconductor substrate. The system may include a transmitter and receiver that have low inductance couplings to the line or conductor to take advantage of the parasitic properties of the conductor when retrieving at the receiver a substantially lossless high-speed current signal.

2. Description of the Related Art

The following descriptions and examples are not admitted to be prior art by virtue of their inclusion within this section.

Information within either a digital or analog system is typically conveyed as a signal along a conductor. In order to accurately discern the conveyed information, the signal must be placed upon a node at the proper time and having the proper magnitude as determined by factors such as the phase and magnitude of the transmitted signal and length and conductivity of the conductor. As the routing distance of the conductor increases, loading properties of the line can have a profound effect on the signal and whether the signal arrives at its destination at the proper time and amplitude.

To ensure accurate signaling, careful attention must be placed on the load and, particularly, the parasitic loading effects of a conductor to which a signal source and signal destination are coupled. Although undesired, any conductor that transports a signal has certain parasitic loading properties. Those properties can be modeled as resistor, capacitor, and inductor periodically placed along the conductor to impart an impedance on that conductor. The resistive and reactive components may cause a linear shift in phase as well as a change in amplitude on any transient signal forwarded on the conductor.

While an ideal conductor does not contain parasitics, such parasitics are nonetheless present to cause a destination circuit or subsystem connected thereto to receive a phase-shifted/attenuated signal that may cause the destination subsystem to receive the wrong information. For example, instead of receiving a targeted voltage at a specific time, an attenuated voltage might result at that time and the amount of attenuation might cause the destination subsystem to, for example, mistakenly read a logic low voltage value rather than a logic high voltage value.

The reactive and resistive components of impedance can oftentimes be modeled as a simple resistive-capacitive ("RC") or resistive-inductive-capacitive ("RLC") circuit. The RC or RLC components attribute an RC time constant or RLC time delay to any signal sent across the conductor. As the time constant increases, the amount of delay between a transient input signal to the conductor and a resultant, transient output signal will increase. The time constant and time delay affect the responsiveness at the receiving end, and the time constant is herein defined as the time difference between when an ideal step waveform would have reached a certain percentage of its eventual value at the receiver and when the real signal reaches that value, had an ideal step waveform been applied at the transmitting end of the conductor. An RLC time delay can be considered to be the time between when a transmitted waveform reaches a certain percentage of its eventual value at the transmit end and when the received waveform reaches that percentage of its eventual value. As the conductor increases in length, the amount of time delay will increase.

With the proliferation of integrated circuits, many conductors are by design placed partially across an integrated circuit from a source electronic subsystem to a destination electronic subsystem, also formed on the integrated circuit. According to well-known photolithography techniques, the conductor is a trace conductor patterned from a layer of metal or metal alloy. The metal trace conductor has certain plate and fringe capacitive effects and, due to the limited cross-section of the metal trace (as well as the metal conductive properties), the trace conductor also has a per-length resistive value.

Signals transmitted by electronic subsystems coupled to one end of a trace conductor experience the time delay and attenuation effects of the parasitic circuit, which will cause the input to the receiving electronic subsystem to misread the signal if the conductor is too long. Most designers recognize this problem and, in many instances, periodically place buffers that act as repeaters along the conductor. Each buffer requires power and, moreover, each buffer will introduce delay into the signal. Depending on the distances between buffers, the voltage swing at the source, and the clock frequency, significant charge can be stored on the parasitic capacitors in the interim between swings. The stored charge will cause relatively long conductors to consume significant power by virtue of charging and discharging the capacitance along the line, that manifests itself as current, and which performs no otherwise useful function and is therefore wasted. Total capacitance is proportional to the conductor length. Thus, charge being stored is proportional to the conductor length for a given voltage. Long conductors consume significant power partially due to parasitically stored charge and partially due to power consumption at each buffer. Undue delay coupled with unsatisfactory power consumption can cause significant problems for high-speed circuits.

It would be desirable to implement a new signaling system and method that avoids having to periodically buffer signals sent across an on-chip trace conductor, or having to use any of the other methods conventionally available and appropriate. As defined herein, "on-chip" means a conductor formed during photolithography upon a portion of a monolithic substrate. The improved signaling system should avoid the conventional methodology of using either voltage signaling or current signaling. In other words, the improved system need not use a voltage source for generating a signal onto a line and an electronic system at the destination that recognizes voltage levels, albeit attenuated and possibly delayed. The same can be said for current signaling, where current is driven onto the line and fluctuations in current are received at the destination. Instead, the desired system should be one that welcomes the effect of at least parasitic resistance by using a variable voltage driven onto the line and received as a variable current, measured as the variable voltage divided by the parasitic resistance. The variable current purposefully uses the parasitic resistance of the line, which can then be received with little delay and attenuation at the destination electronic subsystem.

SUMMARY OF THE INVENTION

The problems outlined above are in large part solved by an improved signaling system and method hereof. The signaling system preferably includes a signal generator or transmitter coupled to a signal receiver via a conductor having parasitic loading effects. Parasitic loading by design does not involve capacitors and resistors purposefully placed on the conductor. However, even with capacitors and resistors purposefully placed (i.e., non-parasitic loading occurring), the present signaling system applies. The signal generator can simply be an electronic subsystem that produces an output. That output, regardless of whether it is analog or digital, can change. The amount of change can occur at a very high rate depending on, for example, the frequency of the signal sent into and/or produced from the source electronic subsystem. The variable voltage is then placed onto a source termination or source coupling of the parasitic-loaded conductor. Specifically, the only impedance of consequence to the parasitic-loaded conductor is the RC or RLC parasitic components associated with the conductor. The relatively low impedance source coupling onto the conductor allows for any steady-state current through the conductor to be measured at the other end of the conductor by the receiver or signal receiving circuit.

The signal generator or transmitter thereby operates as a voltage source. As the voltage value from the voltage source changes, a current will be registered at the opposite end of the conductor if the opposite end is preferably fixed in voltage. The voltage at the opposite end (i.e., second end) of the conductor is defined to determine the common-mode or mid-swing level of current.

The signal receiving circuit or receiver receives fluctuation in current caused by changes in the voltage source divided by a fixed parasitic resistance of the conductor. The changing current signal at the signal receiving circuit can be reflected upon another node that is independent and separate from the fixed (or "pinned") node into which the variable current signal is received. Regardless of whether the destination electronic subsystem processes primarily current or voltage signals (typically voltage), or of whatever levels, the receiver circuit translates the received current signal into the appropriate signal to be processed further by the destination subsystem. In either instance, the current signal received by the signal receiving circuit is proportional to, and substantially non-delayed relative to, the variable voltage value produced from the voltage source.

According to one embodiment, a signaling system is provided. The signaling system includes a conductor having parasitic resistance. A voltage source is coupled to a first end of the conductor and produces a variable voltage value. Coupled to the other end of the conductor is a signal receiving circuit that can receive a current signal proportional to the variable voltage value divided-by the parasitic resistance. The current signal is therefore used to signal information to the destination electronic subsystem and, preferably, performs this function with very little delay between changes in the voltage value produced from the voltage source and the current signal received at the signal receiving circuit.

According to another embodiment, a signal receiving circuit is provided. The signal receiving circuit includes a relatively low impedance node coupled to a second end of a conductor. The low impedance node is adapted to receive an input (or "transmitted") voltage value imparted to a first end of the conductor divided by a parasitic resistance to produce a current signal. The current signal may then be forwarded to a high impedance node. The high impedance node allows for a voltage fluctuation on that node indicative of an output voltage value proportional to fluctuations in the transmitted voltage value.

According to yet another embodiment, a method is provided. The method includes forwarding a variable input voltage value onto a first end of a conductor. The variable current value from a second end of the conductor is then measured as a function of the variable input voltage value divided by a parasitic resistance attributed to the conductor. The variable current value is then conveyed through a relatively low impedance node to a relatively high impedance node and may then be placed through a resistor coupled to the high impedance node in order to produce a variable output voltage value.

BRIEF DESCRIPTION OF THE DRAWINGS

Other objects and advantages of the invention will become apparent upon reading the following detailed description and upon reference to the accompanying drawings in which:

FIGS. 1a–1c are circuit diagrams of a driver transmitter coupled to a receiver by a line, or conductor, having parasitic properties, wherein the parasitic properties demonstrate a high impedance transmission medium (FIGS. 1a and 1b) or, if properly terminated with low impedance transmitters and receivers at both ends of the conductor, the impedance characteristics of the transmission medium can be advantageously utilized (FIG. 1c);

FIG. 2 is a timing diagram of a pulse, or variable input voltage value, forwarded from the transmitter onto the line;

FIG. 3 is a graph of voltage values simulated for the circuit of FIG. 1a plotted as a function of position along a line as it evolves over time and where a substantially similar result can be obtained for the circuit of FIG. 1b;

Figure 4:
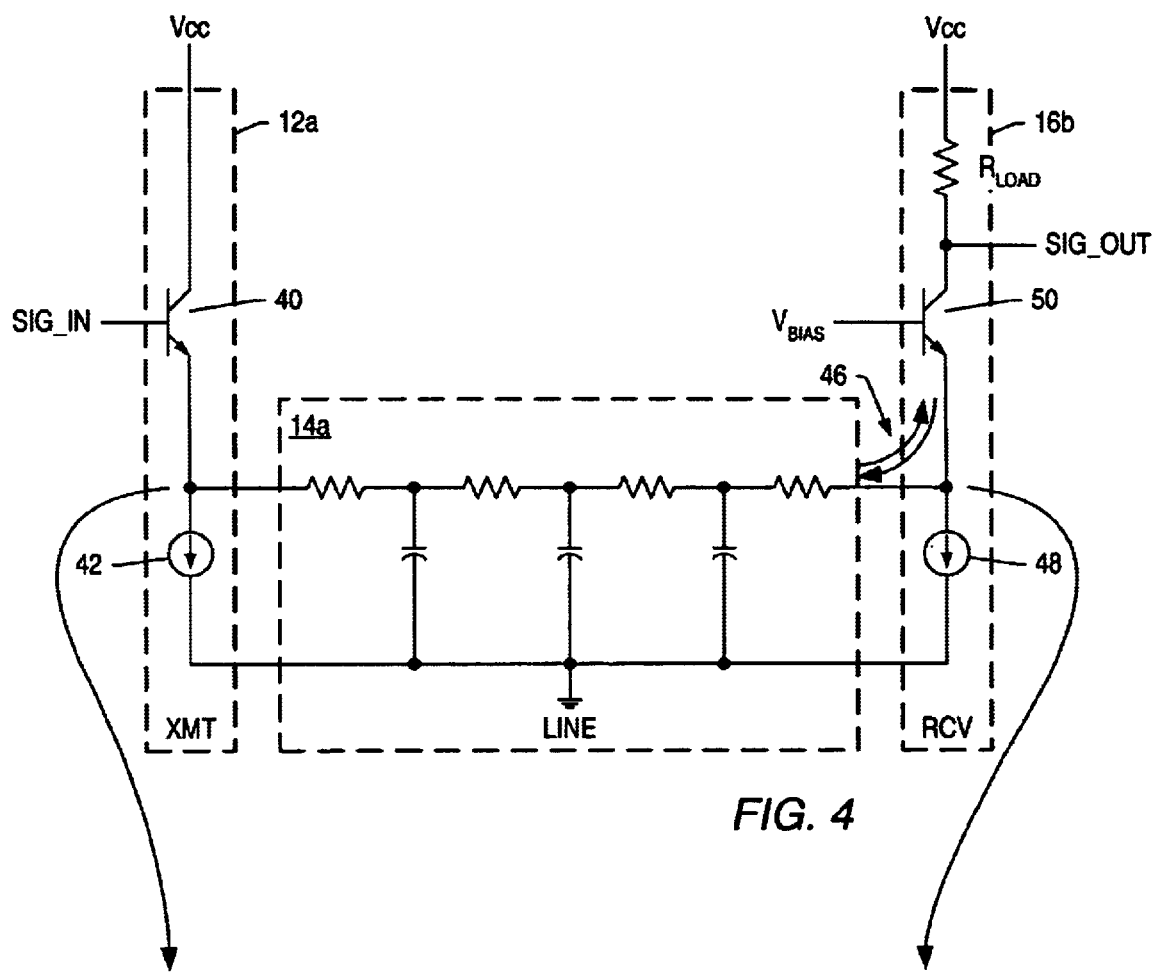
FIG. 4 is a circuit diagram of an improved signaling system, including an improved transmitter and receiver that take advantage of the parasitic properties of the line to generate a substantially lossless signal sent across the line and into the receiver.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1a illustrates a signaling system 10a. System 10a includes a transmitter that has a voltage source 12a connected to a conductor 14a. Also connected to an end of conductor 14a opposite voltage source 12a is a receiver 16a.

Voltage source 12a and receiver 16a can be thought of as electronic subsystems. Voltage source 12a can be an electronic subsystem that produces a voltage output which changes with time. Receiver 16a receives the variable voltage from voltage source 12a via conductor 14a and, depending on the voltage value received, causes the electronic subsystem of the receiver to enter a particular state or logic value outcome. Thus, transmitter and receiver electronic subsystems can be simply circuit subsystems, such as analog circuits, or digital combinatorial or sequential logic.

Conductor 14a is a conductor contained exclusively upon a single monolithic substrate. As opposed to a conductor outside of an integrated circuit, which might have a per-length resistance that is relatively low, conductor 14a is purposely configured on-chip with parasitic resistance attributable to that conductor and, as will be described below, the present signaling system takes advantage of the on-chip parasitic resistance properties when deriving a signal at a destination from a signal at a source. Accordingly, conductor 14a generally does not encompass conductors found off-chip.

Signaling system 10a is shown having a voltage source 12a and a high impedance ("Z HIGH") destination electronic device that receives voltages transmitted thereto from that source. However, the linear nature of impedances within conductor 14a will attenuate and phase shift the voltage sent by source 12a. The signaling system 10a suffers such consequences and is generally labeled as a voltage signaling system.

FIG. 1b, similar to FIG. 1a, also illustrates a signaling system 10b. System 10b is shown having a conductor 14a linked between a current source 12b and a low impedance ("Z LOW") receiver 16b. Unlike the voltage signaling system 10a, current signaling system 10b uses a current source and receives fluctuations in current at the destination.

An ideal voltage source is a two-terminal black box that maintains a constant voltage drop across its terminals, regardless of the current drawn from it. However, an ideal current source is a two-terminal black box that maintains a constant current through the external circuit, regardless of the applied voltage.

A voltage source is best suited to send voltage into an open-circuit load, while a current source is best suited to send current into a short-circuit load. Thus, the load 16a is preferably a high impedance load while load 16b is preferably a low impedance load. Using a high impedance load for a voltage source and a low impedance load for a current source does not appreciably load the source. As used herein, "impedance" represents the total opposition offered by a circuit, such as a load, to the flow of an alternating, pulsating, or transient current sent into the circuit and is measured in ohms. Thus, impedance is the vector sum of the resistance and the capacitive and inductive reactance, i.e., the ratio of voltage-to-current.

As with loads 16a and 16b of the receiver, there is also inductive loading by conductor 14a. Conductor 14a is shown being modeled with various resistive and capacitive components 20 and 22. Capacitors 22 are connected in a low-pass filter arrangement, indicating the propensity of conductor 14a to pass low frequency signals yet initially block rapid changes, or high frequency signals. Thus, conductor 14a, depending on its length, width, composition, and surrounding materials, operates as an RC circuit with an RC delay associated with the resistive and capacitive components 20 and 22. Unwanted (or possibly even wanted by design), components 20 and 22 operate as a RC circuit and cannot be avoided as they are parasitics, even though attempts might be made to mitigate their effect in a conventional scenario.

FIG. 1c represents a substantial improvement over FIGS. 1a and 1b. Instead of implementing a voltage source into a high impedance receiver or a current source into a low impedance receiver, signaling system 10c utilizes a voltage source 12a into a low impedance receiver 16b. This is typically contrary to conventional uses of voltage sources that generally avoid low impedance loads as shown in FIG. 1a. The advantages of signaling system 10c is better understood not as a voltage signaling system or a current signaling system, but as a "transconductance" signaling system.

As a low impedance load 16b, current is readily accepted and, therefore, transconductance is established within line 14a (i.e., transconductance normally is the measure of gain capability of a transistor within, e.g., voltage source 12a and, when applied to the signaling system herein below described, transconductance is simply current derived from a voltage, as well as transported from one port to another port (i.e., between ports at opposite ends of a conductor). Thus, transconductance as used herein represents a change in output current forwarded through low impedance receiver 16b as a function of change in input voltage upon voltage source 12a). Thus, transconductance signaling comprises a variable voltage placed onto a conductor containing RC loading, with current retrieved at an opposing end of the conductor being fed into a low impedance node of a receiver. The relationship between the variable input voltage and the variable output current used by the receiver is purposefully established by, e.g., the parasitic loading effects, specifically resistance, and the application of ohms law.

Thus, transconductance signaling system 10c involves driving an on-chip conductor 14a with a voltage signal by voltage source 12a, allowing the conductor resistance (e.g., parasitic resistance) to convert the voltage signal into a current signal and retrieving the current signal by receiver 16b at the end of the conductor or on-chip conductor route. Conductor 14a is driven by a low impedance output from voltage source or voltage transmitter 12a, and receiver 16b input is also a low impedance input.

FIG. 2 illustrates a transient input voltage value 30 applied from voltage source 12a (FIGS. 1a and 1c) onto a first end of conductor 14a (FIGS. 1a and 1c). Arrow 32 indicates a transient voltage value 30 derived from voltage source 12a. FIG. 3 indicates a simulation of an actual voltage signaling system 10a (FIG. 1a). The simulation illustrates at a first end (position 1) of conductor 14a, an input voltage value is ramped upward in time. For example, the input voltage value can be that shown in phantom in FIG. 2, which increases from 1.55 volts to 1.65 volts in approximately 60 ps. At the end of the line (i.e., conductor 14a at position 10), significant attenuation will occur in the voltage signaling system 10a. The attenuation is caused in part by the RC delay due to temporary storage of charge within capacitors 22 of conductor 14a. The combination of parasitic capacitance and parasitic resistance will attenuate and delay the corresponding rise in voltage at position 10 relative to position 1. If the RC delay is significant, the amount of rise at position 10 may not be enough to drive the destination electronic subsystem to the required value within a required time limit. As shown, even at 140 ps, rise at position 10 barely exceeds 1.58 volts, which may not be enough to register a logic high voltage value at the input to a receiving logic gate. Current signaling suffers the same drawbacks as voltage signaling. Clearly, an improved signaling system such as a transconductance signaling system is needed.

FIG. 4 illustrates a transconductance signaling system 10c. System 10c includes a voltage source or transmitter 12a, a conductor, line or conductive route 14a, and a signal receiving circuit or receiver 16b. The voltage source 12a is preferably configured as an emitter (or source) follower since the output of source 12a is the emitter (or source) of a transistor 40. A variable voltage value can be forwarded onto the input signal ("SIG_IN") line and placed onto a high impedance base (or gate) terminal of transistor 40 to switch (i.e., drive or force) a current from the power supply node into the emitter follower (source follower) output node connected to the conductor 14a to cause the voltage of the source end of the conductor to follow that of the input signal, thus placing the input signal on the conductor. The amount of current that is required to force the source end node of conductor 14a to a required voltage value is determined by the impedance of that node. A current source 42 is coupled between the output and ground. Examples of various ways to configure a current source include a resistor-plus-voltage source or a transistor current source, both of which are well known in the art. Current source 42 assures that whatever transient current is produced through the emitter of transistor 40 is forwarded into conductor 14a and not through current source 42. Whatever current is produced by the emitter of transistor 40 is, therefore, channeled into conductor 14a.

Similar to voltage source 12a, the signal receiving circuit 16a also includes a current source 48. Whatever current 46 is being sourced from conductor 14a is sent into the emitter (or source) terminal of transistor 50 and not into current source 48 since current source 48 supplies or draws the same current regardless of the current out of the second end of conductor 14a. Conductor 14a either supplies or draws current 46 and the transistor 50 complies (i.e., takes or supplies the transient current) as long as the current supplied or drawn is within its operating range, which is mostly determined by the value of current chosen for the current source and the value chosen for the load resistor. Current sourced from conductor 14a thereby sees a low impedance at the emitter of transistor 50 when viewed from the emitter to the base of transistor 50. The low impedance from the emitter to the base creates a low impedance node at the second end of the conductor 14a if the base of transistor 50 is also affixed to a low-impedance node. The $V_{BIAS}$ voltage is preferably fixed (i.e. low impedance) to ensure the impedance seen at the emitter of transistor 50 is also low. Transistor 50 causes current to pass through $R_{LOAD}$ and through the collector/emitter path, the transient portion of the current being shunted from current source 48 and into conductor 14a via the second end. In other words, current source 48 allows the current that is more, or less, than its DC value (i.e., the transient current) to pass to the second end of conductor 14a. Any current that is received upon or returned from conductor 14a is added to, or subtracted from, the DC biasing current flowing through $R_{LOAD}$ which allows the transient current to be reflected as a transient voltage signal at the receiver output to be subsequently processed by another circuit.

Thus, in effect, the signal receiving circuit 16a "clamps" the emitter node voltage of transistor 50 (and hence, the voltage at the second end of conductor 14a) at a value a threshold voltage less than $V_{BIAS}$. (The voltage at the second end of conductor 14a is typically at a voltage value between the maximum and minimum voltage value placed upon the first end of conductor 14a.) The transistor 50 is thereby configured as a common base (or common-gate for MOS) transistor circuit, with the base (or gate) tied to a fixed and predetermined voltage value. The current within current source 48 is also fixed to assure fluctuations in current within the conductor are passed exclusively through the emitter (or source) terminal of transistor 50. That way changes in the input voltage value of the signaling system can be directly reflected as changes in current in the emitter of transistor 50 and, for the most part, also as changes in current through the collector terminal of transistor 50 and through $R_{LOAD}$ and be reflected as changes in an output voltage value on the output signal line.

It is important to note that bipolar transistors are shown in FIG. 4. However, MOS transistors can be substituted and can achieve an equivalent function to the bipolar transistors. For example, a gate of a MOS transistor can be substituted for the base of a bipolar transistor, and the source and drain terminals of an MOS transistor can be substituted for the emitter and collector of a bipolar transistor in the embodiment shown in FIG. 4.

Figure 5:
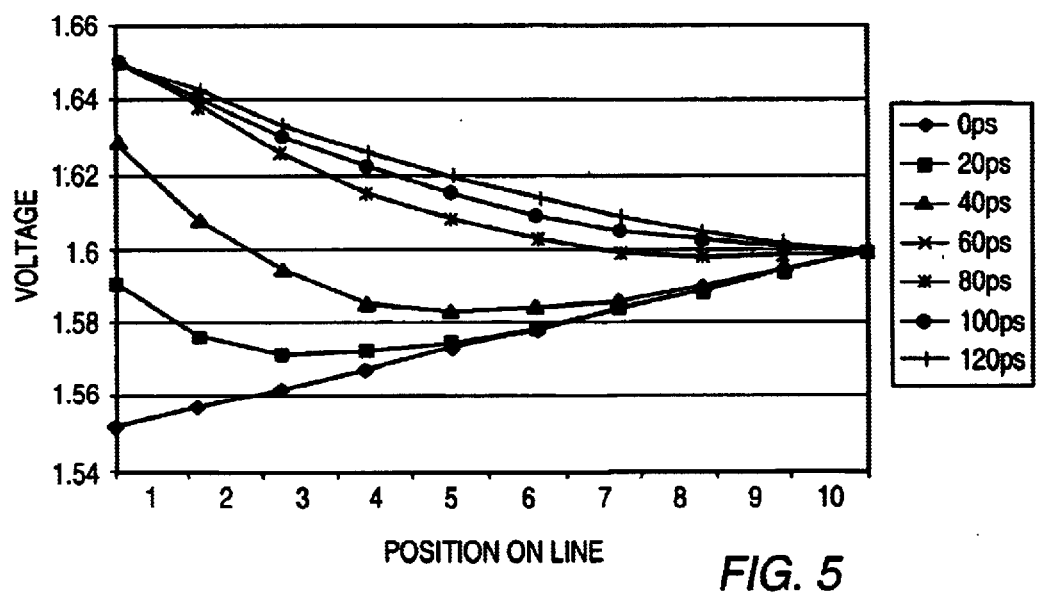
FIG. 5 is a graph of voltage values simulated for the circuit of FIG. 1c plotted as a function of position along a line as it evolves over time using ideal sources yet equally applicable in principle to the actual circuit shown in FIG. 4.

FIG. 5 illustrates a transient voltage placed into the first end of conductor 14a by voltage source 12a, and the effect of a change in voltage at the first end on a pinned voltage at the second end. Thus, while the first end is free to transition between approximately 1.55 volts to approximately 1.65 volts in the simulated example of FIG. 5, the output is "pinned" at approximately a midline thereof (e.g., 1.6 volts) as shown at position 10, or the second end. By "pinning" the voltage at the second end, changes in voltage on the first end will have a lessened effect on the previously stored charge along the parasitic capacitance of the conductive line 14a. That effect and the benefits derived from the effect are better illustrated in reference to FIGS. 6 and 7.

Figure 6:
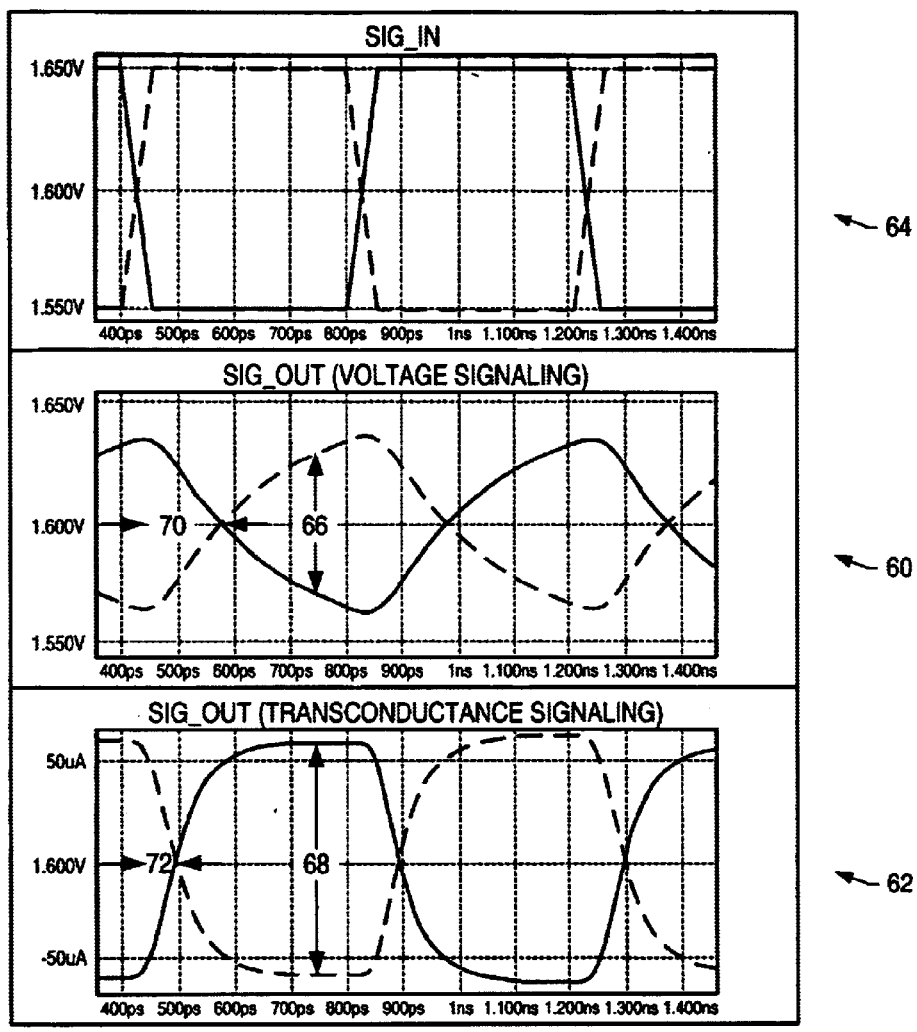
FIG. 6 is a timing diagram of an input signal placed into the transmitter and received at the receiver as an output signal, for the signaling system of FIG. 1a, compared to the signaling system of FIGS. 1c and 4.

Referring to FIG. 6, a comparison is made between a voltage signaling system 60 and a transconductance signaling system 62. For the same input signal that transitions to the same input voltage values as shown by reference numeral 64, FIG. 6 demonstrates greater attenuation 66 in the voltage signaling example than attenuation 68 in the transconductance signaling example. In addition, voltage signaling provides a greater delay 70 at the output signal node (i.e., position number ten—second end) than delay 72 shown for transconductance signaling at the same output (i.e., position number ten—second end). In addition to the lessened attenuation and lessened delay, there is a lessened amount of stored charge and hence, less wasted signal current sent through the parasitic RC circuit of the conductor. Thus, using a voltage source and measuring a current through a low impedance second end while "pinning" the second end will not only lessen the attenuation and RC delay, but also lessen the stored charge and hence, power consumption, while at the same time maximizing the overall bandwidth throughput across a conductor having RC loading effects, or RC parasitic properties. In addition to this, transconductance signaling that uses a "pinned" second end and a low impedance emitter or source at the second end while allowing for faster conveyance of current received on that end, also demonstrates less impedance throughout the overall conductor, which may also result in reduced susceptibility to noise interference, such as from capacitive crosstalk. These principles are applicable to any conductor, (or on-chip trace, or route) in that the conductor can be adequately modeled as having RC parasitic properties.

Figure 7:
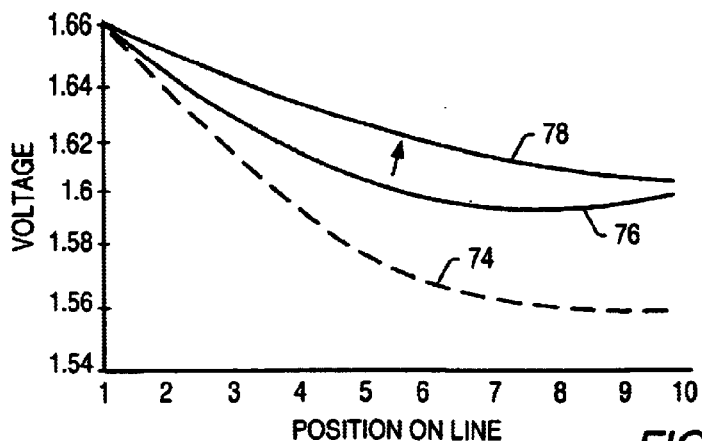
FIG. 7 is a graph of voltage values measured at the same time along the line, comparing the graph of FIG. 3 to the graph of FIG. 5 to demonstrate lower charge storage, lower power consumption, and faster response features when using the signaling system of FIGS. 1c and 4.

FIG. 7 illustrates an overlay of a voltage signaling system and a transconductance signaling system. Line 74 indicates a voltage signaling system where a peak voltage can be achieved at position 1 (i.e., a first end) of a conductor at, for example, 60 ps. Nonetheless, there remains sufficiently uncharged parasitic capacitance within the conductor 14a so that position 10 remains at a relatively low voltage. This is not the case for transconductance signaling. Reference numeral 76 indicates for the same 60 ps time instant, the curvature of line 76 being more linear (i.e., relatively closer to its final position) than the curvature of line 74. This indicates a more "steady state" condition. The term "steady state" in this context is defined as that condition where the output signal essentially "tracks" the input signal. In other words, "steady state" is that condition where there is no discernible evidence of transient behavior on the conductor as evidenced by a voltage distribution that is discernibly different than that of a conductor in "static state" (not the same as "steady state", in this context), with static (i.e. "not changing over time") applied source voltage, and the curvature 76 being more linear (i.e., relatively closer to its final position) than curvature 74 demonstrates that. Eventually, after, for example, 120 ps in this simulation, curvature 78 will be achieved which is even more linear than curvature 76. The goal, however, is to achieve "steady state" (as defined here) as quickly as possible so that the output can have minimum delay with respect to the input. Moreover, the current output from the transconductance embodiment will be less attenuated than the voltage output from the voltage signaling embodiment at frequencies beyond the bandwidth of the conductor-plus-load arrangement for voltage signaling.

It will be appreciated to those skilled in the art having the benefit of this disclosure that the various embodiments herein are ones involving a transconductance signaling system, and a method that uses a low impedance transmitter or driver to drive a voltage signal onto a conductor or line. At the distal end from the transmitter (i.e., second end) is a receiver that retrieves current from the second end of the conductor and is also of low impedance. The low impedance at the second end prevents any voltage swing at that end of the conductor, which would otherwise have subjected the current signal at that end to the same parasitic capacitance seen by a voltage signal and, hence, would have considerably attenuated the current signal at the second end. The receiver then translates this current signal into an appropriate signal to be used by a downstream electronic subsystem. The simulations and examples of various quantified inputs and outcomes are merely examples of one particular simulation for one particular conductor and one particular transmitting and one particular receiving circuit. There can be numerous other conductors and parasitic properties and transmitting and receiving circuits simulated. However, the overall result borne out by the simulations is to achieve an improved signal transient behavior (i.e., less transient delay and attenuation) for a signal transmitted across a conductor, less energy stored in the conductor per cycle (greater signaling efficiency), and the ability to drive very long lines (on-chip traces, or "routes"). It is intended that the following claims be interpreted to embrace all such modifications and changes and, accordingly, the specification and drawings are to be regarded in an illustrative rather than a restrictive sense.

What is claimed is:
1. A signaling system, comprising:
   a conductor having parasitic resistance existing along a length of the conductor between opposed first and second ends of the conductor;
   a voltage source adapted to produce a variable voltage value upon the first end; and
   a signal receiving circuit coupled to the second end and adapted to receive a current signal proportional to the variable voltage value divided by the parasitic resistance.

2. The signaling system as recited in claim 1, wherein the voltage source is responsive to a signal placed onto a first node of the voltage source, and the signal receiving circuit comprises a second node that receives a current signal derived from the signal placed on the voltage source.

3. The signaling system as recited in claim 1, wherein the variable voltage produces a current signal into a relatively low impedance node of the first end, and the signal receiving circuit comprises a relatively high impedance node that reproduces an output voltage value from the current signal.

4. The signaling system as recited in claim 1, wherein the conductor is configured exclusively across a portion of a monolithic substrate.

5. The signaling system as recited in claim 1, wherein the voltage source comprises a current source and an emitter terminal or source terminal of a bipolar transistor or a metal oxide semiconductor transistor, respectively, coupled to the first end.

6. The signaling system as recited in claim 5, wherein a base terminal or gate terminal of the bipolar or metal oxide semiconductor transistor, respectively, is coupled to receive an input voltage value.

7. The signaling system as recited in claim 1, wherein the signaling circuit comprises a current source and an emitter terminal or source terminal of a bipolar transistor or a metal oxide semiconductor transistor, respectively, coupled to the second end.

8. The signaling system as recited in claim 7, wherein a base terminal or gate terminal of the bipolar transistor or metal oxide semiconductor transistor, respectively, is coupled to receive a substantially fixed bias voltage, and wherein a collector terminal or drain terminal of the bipolar transistor or metal oxide semiconductor transistor, respectively, is coupled to a load resistor to produce an output voltage value proportional to the current signal.

9. A signal receiving circuit, comprising a relatively low impedance node coupled to a second end of a conductor having a parasitic resistance, wherein the low impedance node is adapted to receive an input voltage value imparted to a first end of the conductor divided by the parasitic resistance to produce a current signal and to communicate the current signal to a high impedance node whose voltage fluctuates indicative of an output voltage value proportional to fluctuations in the input voltage value.

10. The signal receiving circuit as recited in claim 9, wherein the low impedance node at the second end of the conductor is maintained at a substantially fixed voltage.

11. The signal receiving circuit as recited in claim 9, wherein the low impedance node at the second end of the conductor is maintained at a substantially fixed voltage.

12. The signal receiving circuit as recited in claim 9, wherein the current signal changes directly proportional to changes of the input voltage value imparted to the first end determined by a substantially fixed said parasitic resistance that varies in time predominantly only due to temperature changes.

13. The signal receiving circuit as recited in claim 10, wherein, during times when the input voltage value changes, the substantially fixed voltage contributes to a lessening in voltage fluctuations and stored charge upon parasitic capacitors of the conductor as compared to an absence of the substantially fixed voltage.

14. The signal receiving circuit as recited in claim 9, further comprising:
   a current source coupled to the low impedance node; and
   a load resistor coupled to the low impedance node through a transistor, wherein any changes in the current signal placed onto the low impedance node are directed away from the current source and forwarded onto the load resistor to produce the output voltage value.

15. A method for utilizing parasitic properties of a conductor to minimize attenuation of an output signal from the conductor, comprising:

forwarding a variable input voltage value into a first end of the conductor;

receiving a variable current value from a second end of the conductor opposite the first end by dividing the variable input voltage value by a parasitic resistance of the conductor; and conveying the variable current value through a relatively low impedance node to a relatively high impedance node and through a resistor coupled to the high impedance node to produce the output voltage value.

16. The method as recited in claim 15, wherein said conveying comprises directing substantially all of the variable current value into the relatively low impedance node exclusive of a current source coupled to the low impedance node.

17. The method as recited in claim 15, wherein said forwarding comprises placing the variable input voltage value into a transistor having its emitter or source coupled to the first end.

18. The method as recited in claim 15, wherein said placing comprises forwarding substantially all of the variable input voltage value onto a relatively low impedance said first end to generate current into the first end exclusive of a current source coupled to the first end.

* * * * *

UNITED STATES PATENT AND TRADEMARK OFFICE
CERTIFICATE OF CORRECTION

PATENT NO. : 6,727,730 B1
DATED : April 27, 2004
INVENTOR(S) : Lombaard

It is certified that error appears in the above-identified patent and that said Letters Patent is hereby corrected as shown below:

Column 10,
Lines 48-50, please delete duplicative claim 11.

Signed and Sealed this

Fourteenth Day of September, 2004

JON W. DUDAS
*Director of the United States Patent and Trademark Office*